US008778197B2

(12) United States Patent
Everett et al.

(10) Patent No.: US 8,778,197 B2
(45) Date of Patent: Jul. 15, 2014

(54) GRAPHENE WINDOWS, METHODS FOR MAKING SAME, AND DEVICES CONTAINING SAME

(75) Inventors: William Neil Everett, Cedar Park, TX (US); William Martin Lackowski, Austin, TX (US); Joseph F. Pinkerton, Austin, TX (US)

(73) Assignee: Clean Energy Labs, LLC, Austin, TX (US)

(*) Notice: Subject to any disclaimer, the term of this patent is extended or adjusted under 35 U.S.C. 154(b) by 0 days.

(21) Appl. No.: 14/006,045

(22) PCT Filed: Dec. 21, 2011

(86) PCT No.: PCT/US2011/066497
§ 371 (c)(1),
(2), (4) Date: Sep. 18, 2013

(87) PCT Pub. No.: WO2012/088274
PCT Pub. Date: Jun. 28, 2012

(65) Prior Publication Data
US 2014/0021163 A1    Jan. 23, 2014

Related U.S. Application Data

(60) Provisional application No. 61/427,011, filed on Dec. 23, 2010.

(51) Int. Cl.
| H01B 13/00 | (2006.01) |
| H05K 3/46 | (2006.01) |
| C01B 31/04 | (2006.01) |
| B81C 1/00 | (2006.01) |

(52) U.S. Cl.
CPC .......... *H05K 3/4652* (2013.01); *C01B 31/0453* (2013.01); *B81B 2203/0127* (2013.01); *B81C 1/00158* (2013.01); *B81B 2207/053* (2013.01); *Y10S 977/734* (2013.01)

USPC ................ 216/17; 216/56; 216/78; 216/105; 977/734

(58) Field of Classification Search
CPC ..................... H01L 29/66015; H01L 29/1606; B82Y 40/00; H05K 3/061; H05K 3/427
USPC .......................... 216/17, 56, 78, 105; 977/734
See application file for complete search history.

(56) References Cited

U.S. PATENT DOCUMENTS

| 2009/0110627 | A1 | 4/2009 | Choi et al. |
| 2011/0244210 | A1 | 10/2011 | Choi et al. |
| 2011/0284818 | A1* | 11/2011 | Avouris et al. ............... 257/9 |

FOREIGN PATENT DOCUMENTS

| EP | 0488229 A2 | 6/1992 |
| EP | 2055673 A1 | 5/2009 |
| WO | 2007147643 A2 | 12/2007 |
| WO | 2012088274 A1 | 6/2012 |

OTHER PUBLICATIONS

Patent Cooperation Treaty; PCT International Search Report, Issued in Connection with PCT/US2011/066497; May 15, 2012; 10 pages; Europe.
Patent Cooperation Treaty; PCT Written Opinion of the International Searching Authority, Issued in Connection with PCT/US2011/066497; May 15, 2012; 7 pages; Europe.

* cited by examiner

*Primary Examiner* — Binh X Tran
(74) *Attorney, Agent, or Firm* — Greenberg Traurig, LLP; Ross Spencer Garsson

(57) ABSTRACT

The present invention relates to graphene windows and methods for making same. One method comprises selecting a high purity metal foil, growing a layer of graphene on a first face of the metal foil, patterning the second face of the graphene-modified foil with a polymer, wherein the second face of the graphene-modified foil has an exposed region and etching the second face of the graphene-modified foil in the exposed region until exposing the first layer of graphene.

17 Claims, 15 Drawing Sheets

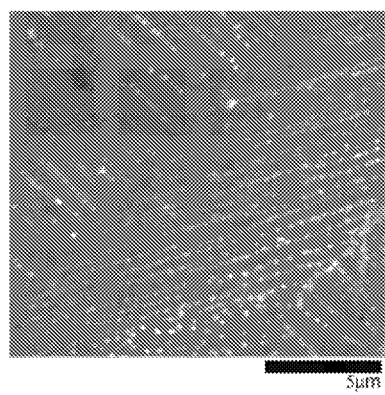
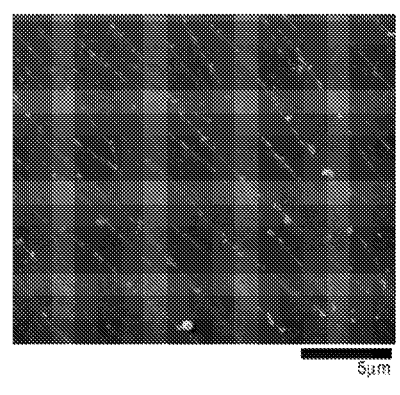
Figure 8A     Figure 8B
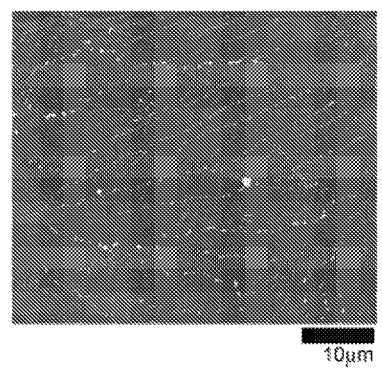
Figure 8C

GRAPHENE WINDOWS, METHODS FOR MAKING SAME, AND DEVICES CONTAINING SAME

CROSS-REFERENCE TO RELATED PATENT APPLICATIONS

This application is the 35 U.S.C. 371 national application of International Patent Application No. PCT/US2011/066497, filed Dec. 21, 2011, which designated the United States and claimed priority to provisional U.S. Patent Application Ser. No. 61/427,011, filed on Dec. 23, 2010. Both of these patent applications are entitled "Graphene Windows, Method For Making Same, And Devices Containing Same," are each commonly assigned to the Assignee of the present invention, and are hereby incorporated herein by reference in their entirety for all purposes.

TECHNICAL FIELD

The present invention relates to graphene windows and methods for making same. The present invention further relates to devices that include such graphene windows.

SUMMARY OF THE INVENTION

Graphene sheets—one-atom-thick two-dimensional layers of $sp^2$-bonded carbon—have a range of unique electrical, thermal and mechanical properties. Just as glass windows are supported on all sides by a stronger structure (such as a wall), a "graphene window" is graphene supported on all sides by a much thicker material (typically metal). Graphene windows can be any shape, such as a round shape like a drum. The graphene of a graphene window generally is grown on its supporting metal (such as Cu).

An advantage of graphene windows is that they can be transferred to another substrate (such as the metal-oxide portion of a graphene-drum switch) without the use of liquid (which tends to tear the graphene when the liquid dries). A reason the graphene windows of the present invention are larger and cleaner than any known to be reported in the literature is because a production method has been developed that uses very pure metal foils as a starting point. In addition to graphene-drum switches, graphene windows can be used to make graphene pumps and other NEM devices.

In addition to graphene windows that are larger and cleaner, it has been found that coating at least one side of the graphene with a few nanometer thick layer of metal can lower the membrane's electrical resistance by an order of magnitude, which is advantageous when making low-loss switches out of graphene.

The present invention further includes making and transferring graphene using metal that is shaped similar to "fly swatters". These metallic structures allow the CVD growth foil to bend without rupturing the graphene windows. In addition, the graphene can be transferred to a target substrate without the use of liquids and can be precisely aligned with specific features located on the target substrate. It has been found that this approach minimizes graphene tears because the edge of a graphene window never has to come into contact with the edge of the target substrate feature.

These metallic "fly swatters" also lend themselves to pick and place machines (which are used for mass production) because a large number of swatters can be made from one sheet of metal foil, each swatter is easily detachable from the foil, and each swatter can be precisely aligned with its target substrate.

Another advantage of the present invention is that these metal-graphene assemblies also allow high current connections to be made to the delicate graphene without physically touching the graphene.

In general, in one aspect, the invention features a method that includes selecting a metal foil having a first face and a second face, wherein the metal foil is a high purity metal foil. The method further includes growing a first layer of graphene on the first face of the metal foil to form a graphene-modified foil. The second face of the graphene-modified foil is either a second layer of graphene on the second face of the metal foil (with the second layer of graphene grown during the step of growing the first layer of graphene) or the second face of the metal foil. The method further includes patterning the second face of the graphene-modified foil with a polymer. The second face of the graphene-modified foil has an exposed region. The method further includes etching the second face of the graphene-modified foil in the exposed region until exposing the first layer of graphene to form a graphene window.

Implementations of the inventions can include one or more of the following features:

The metal foil can be thermally annealed before growing the first layer of graphene.

In general, in another aspect, the invention features a method that includes selecting a metal foil having a first face and a second face. The method further includes thermally annealing the metal foil. The method further includes, after the step of annealing the metal foil, growing a first layer of graphene on the first face of the metal foil to form a graphene-modified foil. The second face of the graphene-modified foil is either a second layer of graphene on the second face of the metal foil (with the second layer of graphene grown during the step of growing the first layer of graphene) or the second face of the metal foil. The method further includes patterning the second face of the graphene-modified foil with a polymer. The second face of the graphene-modified foil has an exposed region. The method further includes etching the second face of the graphene-modified foil in the exposed region until exposing the first layer of graphene to form a graphene window.

Implementations of the above inventions can include one or more of the following features:

The step of annealing can increase the average grain size.

The metal foil can include at least two different metals.

The metal of the metal foil can be Cu.

The graphene can be grown by CVD.

The polymer can be a resolvable, photolithographically amenable polymer. The resolvable, photolithographically amenable polymer can be photoresist.

The patterning of the polymer can include a coating process. The coating process can be a spin-coating process.

The etch process can be either a dry etch process or a wet etch process.

The method can further include dissolving the polymer after etching. The method can further include rinsing off the polymer residue.

The method can further include, before the step of growing the first layer of graphene, applying a protective coating on the second face of the metal foil. The protective coating can prevent graphene from growing on the second face of the metal foil during the step of wowing the first layer of graphene. The method can further include removing the protective coating from the second face of the metal foil such that the second face of the graphene-modified foil is the second face of the metal foil.

The method can further include growing the second layer of graphene on the second face of the metal foil during the step of growing the first layer of graphene. The method can further include removing the second layer of graphene on the second face before the step of patterning, such that the second face of the graphene-modified foil is the second face of the metal foil.

The metal foil can include at least 99.99% of the metal.

The metal foil can include at least 99.999% of the metal.

The method can further include positing a material on the graphene on the first face of the graphene-modified foil before the step of patterning the second face of the graphene-modified foil with a polymer. The material can be a metal. The material is a patterned material.

The step of depositing the material can include one or more of the following processes: electroplating, chemical bonding, thermal evaporation, and e-beam evaporation.

A photolithographic method can be used to define the pattern material on the second face of the graphene-modified foil.

The graphene window can be formed having a feature atop. The feature atop the graphene window can be a patterned feature.

The metal foil can have native or doped impurities. The metal foil can include at most 99.8% of the metal.

During the step of thermal annealing, the impurities can be move toward grain boundaries of the metal foil.

The graphene window formed can have adhered, concentrated impurities.

The adhered, concentrated impurities can be located at the grain boundaries.

The graphene window can have an isolated metal feature. The isolated metal features can be at approximately the center of the first face of the graphene-modified foil.

In general, in another aspect, the invention features a method that includes forming an array of supports on a material. The material comprises a material on which graphene windows can be formed. The array of supports each have a plurality of graphene windows.

Implementations of the invention can include one or more of the following features:

The material can be a semiconductor.

The material can include silicon carbide.

The material can be a metal foil and the supports can be metal foil supports.

The graphene windows can be made using one or more of the methods of the above disclosed inventions.

Each array can be located on a supported region of the material.

A support in the array of supports in a supported region of the material can be removed without damaging the graphene windows on the support and without damaging the graphene windows of the supports in neighboring supported regions.

The support from the supported region can be mated with a metal oxide chip such that the graphene windows are aligned with etched features on the metal oxide chip. The support from the supported region and the metal oxide chip have alignment marks that can be utilized for the step of mating. The support from the supported region and the metal oxide chip can be secured and wire bonded.

The support from the supported region can be mated with an insulator-conductor assembly such that the graphene windows are aligned with etched features on the insulator-conductor assembly. The support from the supported region and the insulator-conductor assembly can have alignment marks utilized for the step of mating. The method can further include electrically contacting an electrical conductor with the graphene windows of the support from the supported region. The method can further include flowing a current from the electrical conductor, through at least some of the graphene windows in the array, and to the insulator-conductor assembly.

In general, in another aspect, the invention features a method of forming a multi-layered graphene window. The method includes forming a graphene-modified foil having a first graphene window. The method further includes transferring a second graphene window and placing it on top of the first graphene window to form a multi-layered graphene window having two layers of graphene.

Implementations of the invention can include one or more of the following features:

The method can further include transferring a third graphene window and placing it on top of the second graphene window to form a multi-layered graphene window having three layers of graphene.

The method can include transferring n graphene windows n number of times to form a multi-layered graphene window having n+1 layers of graphene. The number of transferred graphene windows, n, can be at least 2.

The graphene windows can be made using one or more of the methods of the above disclosed inventions.

In general, in another aspect, the invention features a method of forming a graphene electromechanical assembly. The method includes growing graphene on a substrate to create a graphene-substrate assembly. The method further includes partially etching the substrate of the graphene-substrate assembly to create a graphene window assembly. The method further includes forming an insulator-conductor assembly with an array of etched features. The method further includes joining the graphene window assembly with said insulator-conductor assembly.

Implementations of the invention can include one or more of the following features:

The step of joining can be done in a partial vacuum.

The step of joining can place at least one graphene window over at least one etched feature.

The graphene window assembly can be aligned with the insulator-conductor assembly using alignment marks.

The method can further include electrically contacting an electrical conductor with the graphene window assembly. The method can further include flowing a current from the electrical conductor, through the graphene window assembly, and to the insulator-conductor assembly.

In general, in another aspect, the invention features a composition made using one or more of the methods of the above disclosed inventions.

In general, in another aspect, the invention features a device that includes a composition of the above disclosed inventions.

In general, in another aspect, the invention features an assembly made using one or more of the methods of the above disclosed inventions.

DESCRIPTION OF DRAWINGS

FIGS. 8A-8C are SEM images of nanoscale impurities remaining after completing the fabrication of free-standing, single-layer graphene spans made using the scheme depicted in FIGS. 7A-7H.

DETAILED DESCRIPTION

The present invention relates to graphene windows and methods for making same. The present invention further relates to devices that include such graphene windows.

Production of Graphene

There are a number of known ways to produce graphene. For instance, graphene can be produced as follows:

Cu foil is pre-cleaned in acetic acid for 10 min, rinsed thoroughly with Dl water, and then dried with a stream of $N_2$. The foil is then annealed in a vacuum reaction furnace to increase the average grain size. The furnace is evacuated to <150 mTorr, $H_2$ (25 sccm) and Ar (150 sccm) is introduced at 20° C., and then the temperature is increased to 500° C. and maintained for 1 hour.

Following the annealing step, the Ar flow is stopped, the furnace temperature is raised to 750° C., and then Chemical Vapor Deposition (CVD) graphene is grown by flowing in $CH_4$ at 140 sccm+$H_2$ (at 25 sccm) for 45 min, after which time the $CH_4$ flow is terminated.

Following graphene growth, the graphene-modified foil is cooled to 350° C., the $H_2$ flow is stopped, Ar (25 sccm) is introduced, and then the furnace was held at 350° C. for 4 hour. (As used herein, "graphene-modified foil" is a metal foil that has a layer of graphene on at least one face). The graphene-modified foil is then cooled to 20° C., the Ar flow stopped, and then the pressure is brought back to ambient with air.

For the embodiments discussed and described herein, the above method was made to produce graphene.

If desired, before growing the graphene on the metal foil, a protective layer (such as gold or chromium) can be applied to one side of the metal foil (the "backside") that would prevent the growth of graphene on that side. After the graphene is grown on the other side (the "frontside") of the metal foil, the protective layer can then be etched away from the backside using techniques known in the art. By such a method, the graphene would not need to be removed (such as by etching) from the backside of the metal foil.

Scheme 1

Figure 1:
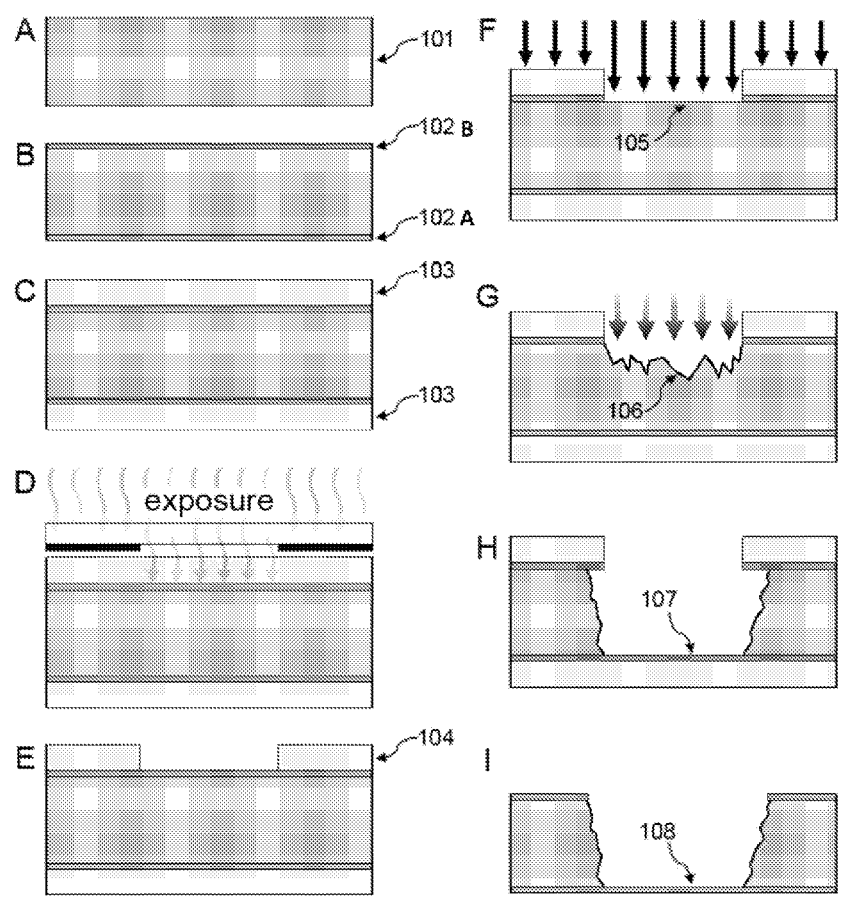
FIGS. 1A-1I depict a scheme for creating "clean" (low impurity level) and low-defect suspended graphene windows supported on metal foil.

FIGS. 1A-1I depict a scheme (Scheme I) for creating "clean" (low impurity level) and low-defect suspended graphene windows on a metal foil support. As shown in FIG. 1A, high purity, clean metal foil 101 (e.g., Cu) is annealed to increase average grain size. As used herein, a "high purity metal foil" is a metal foil that has approximately 99.99% or more of the metal (or metals) of the metal foil. As shown in FIG. 1B, graphene is grown (e.g., via CVD) on both foil faces (graphene 102A and graphene 102B) to form a graphene-modified foil. As shown in FIG. 1C, a resolvable, photolithographically amenable polymer 103 (i.e., photoresist) is spin-coated on both sides of the graphene-modified foil. As shown in FIGS. 1D and 1E, a photolithography process is used to form a pattern 104 of the photoresist 103. As shown in FIG. 1F, an etching process (dry or wet etch) is utilized to etch away graphene 102B in exposed region 105 of the photoresist 103. As shown in FIGS. 1G and 1H, metal foil 101 is etched 106 until the opposite graphene surface 107 of the graphene 102A is reached. As shown in FIG. 1I, the photoresist 103 is dissolved and the polymer residue is rinsed, which leaves behind the suspended graphene window 108.

Using high purity Cu foils results in suspended graphene without the presence of impurities adhered to the graphene. When CVD graphene is grown on lower purity Cu foils, impurities tend to become concentrated at Cu gain boundaries during the pre-annealing and growth phases. Impurities remained adhered to the suspended graphene window following removal of the underlying Cu support. It has also been determined that the defect (e.g., holes, tears) density is significantly reduced when using ammonium persulfate as the Cu etch, as opposed to ferric chloride-based etches.

Furthermore, either single- or double-layer graphene windows can be produced if the backside graphene (shown in FIG. 1F) is or is not (respectively) etched away. If not previously removed by etching, the backside graphene collapses onto the graphene on the opposite side of the foil as the metal is completely etched away beneath it; pre-etching the backside graphene away eliminates the formation of graphene double-layer windows.

Additionally, graphene mechanical and electrical properties improve (likely related to reduced defect density) as average grain size in the metal foil increases.

Figure 2:
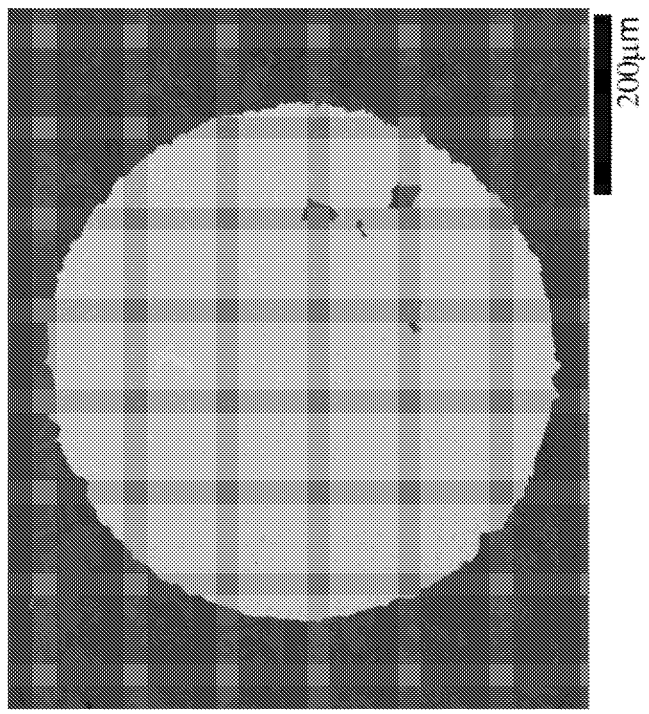
FIG. 2 is a SEM image of a ~575 μm span of free-standing, single-layer graphene supported on etched Cu foil made using the scheme depicted in FIGS. 1A-1I.

Using this scheme, free-standing circular graphene spans of up to 575 μM in diameter have been achieved. FIG. 2 is a SEM image of a ~575 μm span of free-standing, single-layer graphene supported on etched Cu foil.

Figure 3:
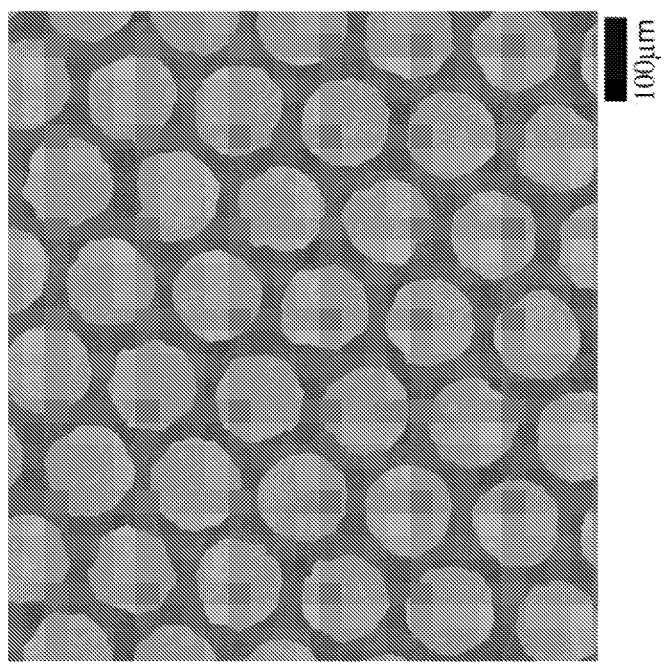
FIG. 3 is a SEM image of an array of ~100 μm circular spans of free-standing, single-layer graphene supported on etched Cu foil made using the scheme depicted in FIGS. 1A-1I.

FIG. 3 is a SEM image of an array of ~100 μm circular spans of free-standing, single-layer graphene supported on etched Cu foil.

Figure 4:
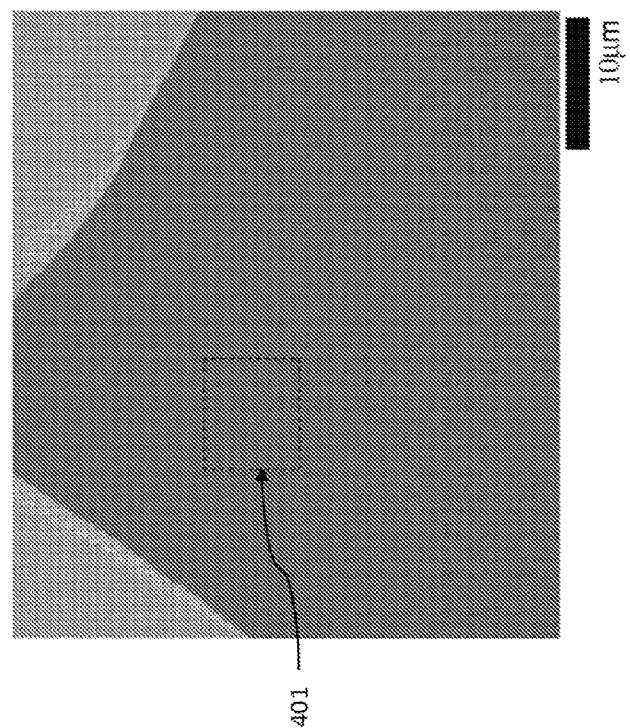
FIG. 4 is a SEM image of a span in clean, free-standing, single-layer graphene prepared with ultra-pure (≥99.999%) Cu foil made using the scheme depicted in FIGS. 1A-1I.
Figure 5:
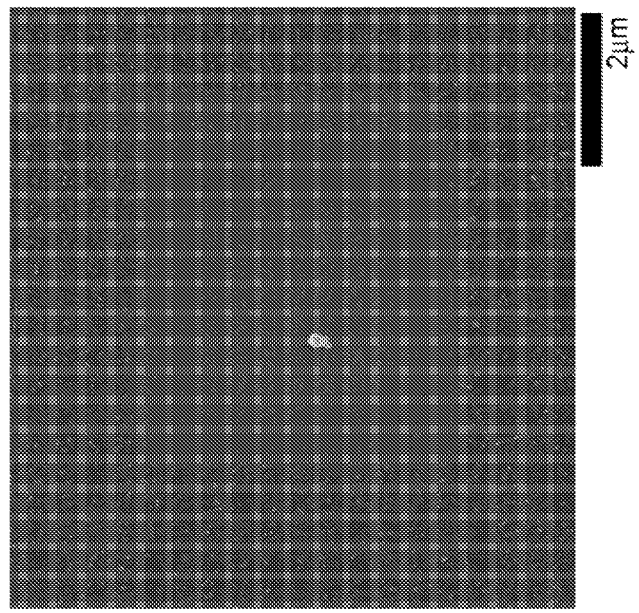
FIG. 5 is a higher magnification view of the SEM image of FIG. 4 (view corresponding to dotted box 401) showing removal of residual polymer by electron beam exposure around a small particle adhered to the graphene.

FIG. 4 is a SEM image of a span of clean, free-standing, single-layer graphene prepared with ultra-pure (≥99.999%) Cu foil. FIG. 5 is a higher magnification view (view corresponding to dotted box 401 in FIG. 4) showing removal of residual polymer by electron beam exposure around a small particle adhered to the graphene. This one defect present was intentionally imaged to confirm the presence of graphene.

Scheme 2

FIGS. 6A-6J depict a scheme (Scheme 2) for patterning a material (e.g., another metal such as Au) in a controlled fashion on the suspended graphene window on a supported metal foil. Fabrication proceeds just as in Scheme No. 1, with the additional step of patterning and depositing the material on one side of the graphene-modified foil and then doing an aligned etch of the metal away from beneath the patterned feature.

Figure 6:
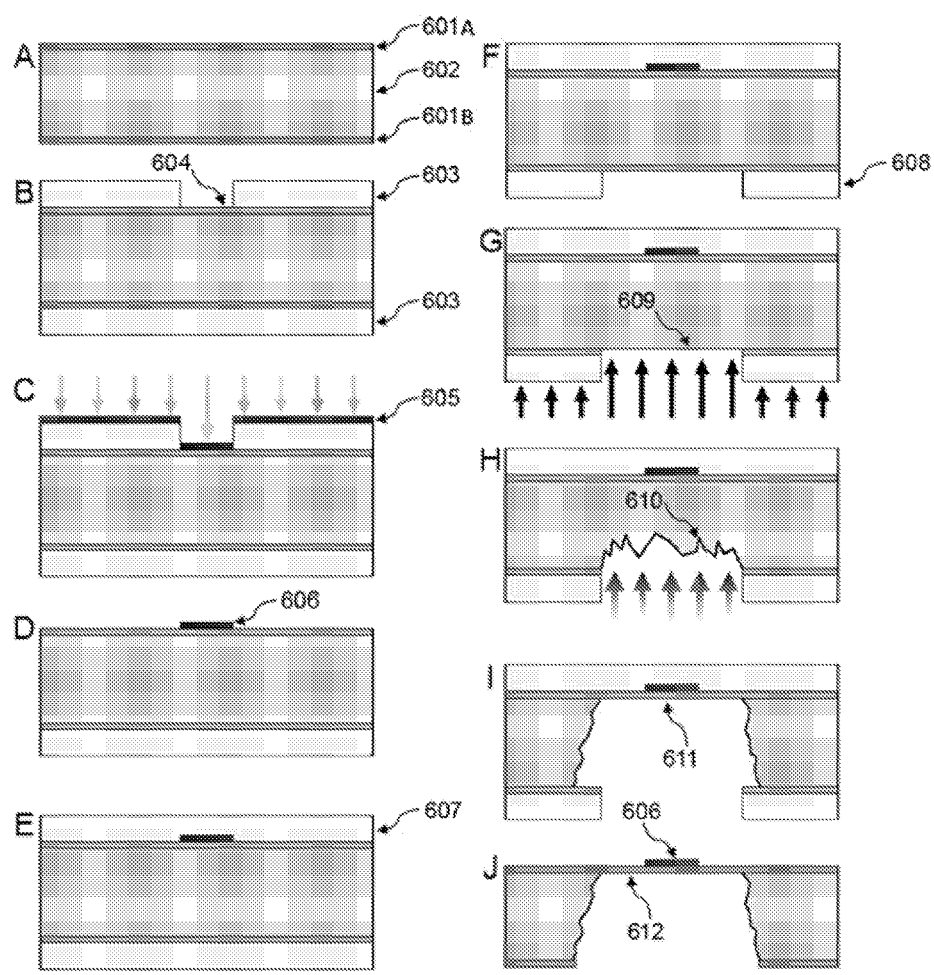
FIGS. 6A-6J depict a scheme for patterning a material (e.g., another metal such as Au) in a controlled fashion on the suspended graphene window on a supported metal foil. This feature is on the opposite face of the graphene as the metal support foil.

As shown in FIG. 6A, graphene (graphene 601A and graphene 601B) is grown (e.g., via CVD) on both sides of clean, pre-annealed metal foil 602 (e.g., Cu). As shown in FIG. 6B, photoresist 603 is spin-coated on both sides of the graphene-modified foil and photolithographically is used to define a deposition region 604.

As shown in FIG. 6C, material 605 (e.g., polymer, metal) is deposited onto the patterned region 604 (e.g., via electroplating or chemical bonding) or deposited uniformly onto the entire surface (e.g., thermal or E-beam evaporation). As shown in FIG. 6D, a lift-off process is performed to define the patterned feature 606. As shown in FIG. 6E, protective polymer 607 (e.g., photoresist) is spin-coated atop patterned feature 606.

As shown in FIG. 6F, a process is performed to align and photolithographically pattern photoresist 608 on the backside of the graphene-modified foil. As shown in FIG. 6G, an etching process (dry or wet) is utilized to etch away graphene 601B in exposed region 609 of the polymer. As shown in FIGS. 6H and 6I, the metal foil 602 is etched 610 through the patterned photoresist until the opposite graphene surface 611 of the graphene 601A is reached. As shown in FIG. 6J, the photoresist is dissolved and polymer residue is rinsed, which leaves behind suspended graphene window 612 with patterned material feature 606 atop it.

Scheme 3

FIGS. 7A-7H depict a scheme (Scheme 3) for creating graphene windows supported on metal foil having native or doped impurities, either intentionally doped or native to the foil, that exploits the tendency of the impurities to migrate to grain boundaries upon heating (during pre-annealing or during graphene growth) (i.e., the native or doped impurities concentrate at grain boundaries within the foil).

Figure 7:
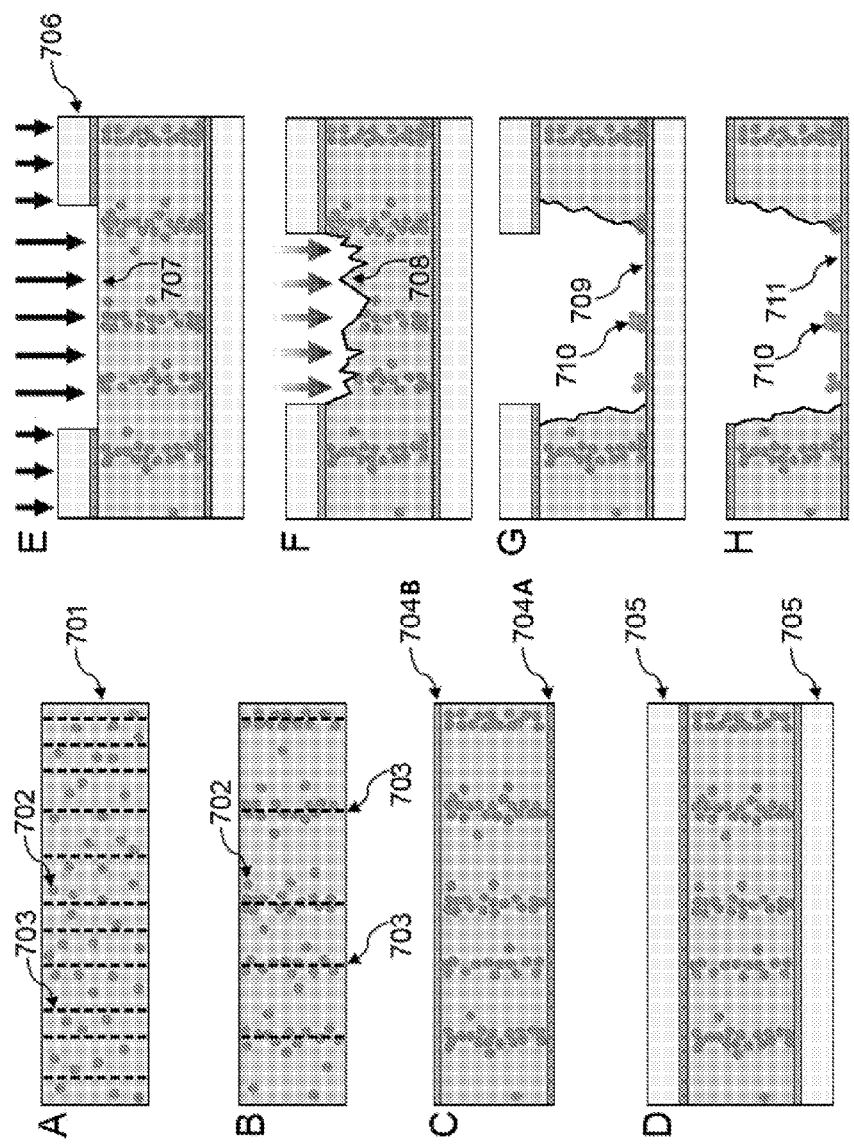
FIGS. 7A-7H depict a scheme for creating graphene windows supported on metal foil having native or doped impurities that concentrate at grain boundaries within the foil.

As shown in FIG. 7A, metal foil 701 (e.g., Cu) with native or doped impurities 702 is utilized. Grain boundaries 703 are indicated by dashed lines. As shown in FIG. 7B, during annealing, impurities 702 move toward, and concentrate at, grain boundaries 703. As this occurs, the grain size increases (i.e., grain boundary density decreases).

As shown in FIG. 7C, graphene (graphene 704A and graphene 704B) is grown (e.g., via CVD) on both foil surfaces (which can result in additional migration and concentration of impurities). As shown in FIG. 7D, photoresist 705 is spin-coated on both sides of the graphene-modified foil. As shown in FIG. 7E, photolithographically is used to pattern resist 706 to allow exposed region 707 of the graphene to be etched away. As shown in FIG. 7F, an etching process (wet etch) is utilized to etch away metal foil 708 through the photoresist pattern 706. As shown in FIG. 7G, the etching selectively stops at graphene-foil interface 709, leaving behind the intact graphene at this interface supported by photoresist with adhered, concentrated impurities 710 on the graphene 704A at the grain boundaries of the metal growth substrate. As shown in FIG. 7H, the photoresist is dissolved and polymer residue is rinsed, which leaves behind suspended graphene window 711 with adhered impurities 710 patterned along grain boundaries, creating nanoscale features.

Because the foil is inherently polycrystalline, there is a fairly regular structure to the grains, which results in nanoscale bands of impurities adhered to the suspended graphene following etching and window formation. The size of the features and periodicity could be controlled by modulating the impurity concentration or grain size by varying annealing conditions (temp, time). It is believed this has potential applications in sensor technology, and it is a straightforward method for producing nanoscale features on suspended graphene structures. FIGS. 8A-8C are SEM images of nanoscale impurities remaining after completing the fabrication of free-standing, single-layer graphene spans made using the scheme depicted in FIGS. 7A-7H. In these experiments, metal foils having ≤99.8% Cu were utilized. It was found that impurities migrated towards the grain boundaries in the metal foil at elevated temperatures.

Scheme 4

FIGS. 9A-9I depict a scheme (Scheme 4) for creating a suspended graphene window on a metal foil (e.g., Cu) support that includes an isolated metal feature on the graphene window, i.e., in the center of the suspended graphene window the substrate is patterned, such as in an annular fashion.

Figure 9:
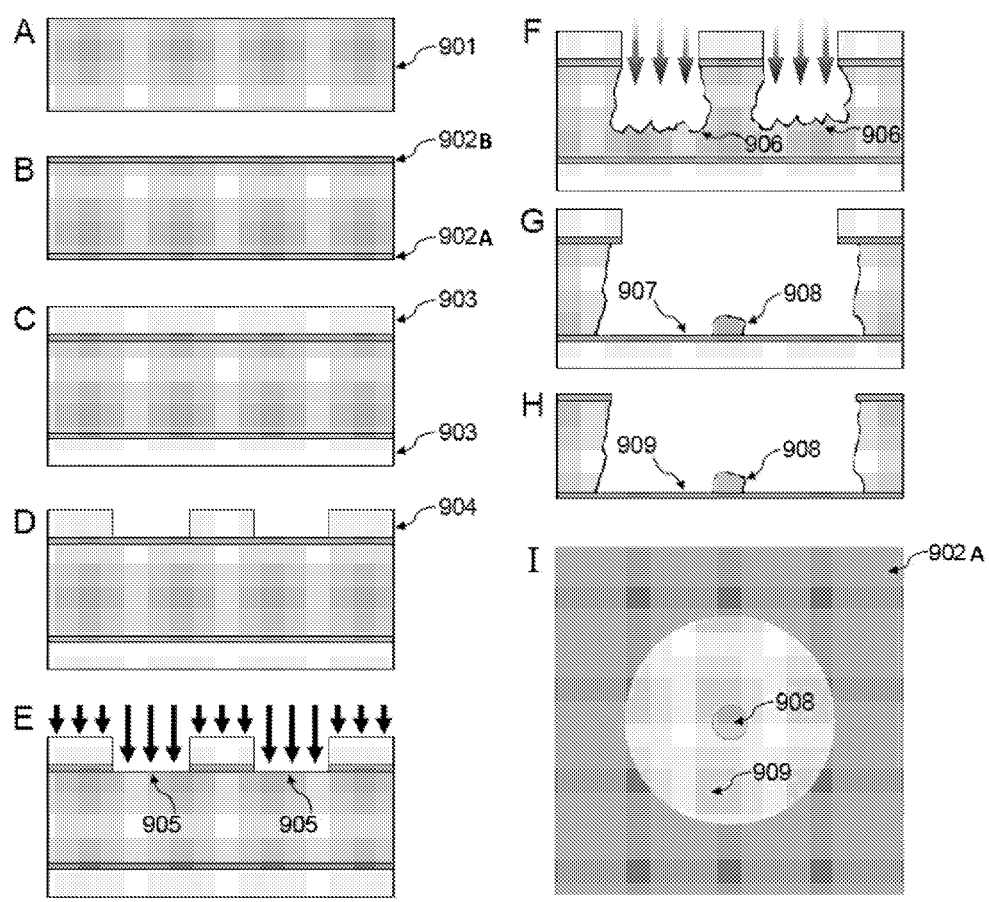
FIGS. 9A-9I depict a scheme for creating a suspended graphene window on a metal foil support that includes an isolated metal feature on the graphene window.

As shown in FIG. 9A, high purity, clean metal foil 901 (e.g., Cu) is annealed to increase average grain size. As shown in FIG. 9B, graphene (graphene 902A and graphene 902B) is grown (e.g., via CVD) on both faces of foil 901. As shown in FIG. 9C, resolvable, photolithographically amenable polymer 903 (i.e., photoresist) is spin-coated on both sides of graphene-modified foil. As shown in FIG. 9D, photolithography is used to pattern photoresist 904. As shown in FIG. 9E, an etching process (dry or wet) is utilized to etch away graphene in exposed regions 905 of the photoresist. As shown in FIG. 9F, the metal foil is etched 906 through photoresist. As shown in FIG. 9G, the etching process etches the metal foil down until opposite graphene surface 907 is reached, leaving behind an isolated Cu feature 908 adhered to the graphene 902A, as the graphene with photoresist island is under-etched away. As shown in FIG. 9H, the photoresist is dissolved and polymer residue is rinsed, leaving behind the suspended graphene window 909 with adherent Cu feature 908. FIG. 9I is a top view of an isolated Cu feature 908 adhered to the graphene window 909 in the center of CVD grown graphene 902A on the Cu foil support.

By adjusting the center feature size relative to the foil thickness and etch time, the lateral and vertical dimensions of the isolated feature can be tuned. An isolated feature with an identical height as the foil thickness could be created by proper choice of dimension and abbreviated etch time (so as to prevent undercutting and release during etching).

Figure 10:
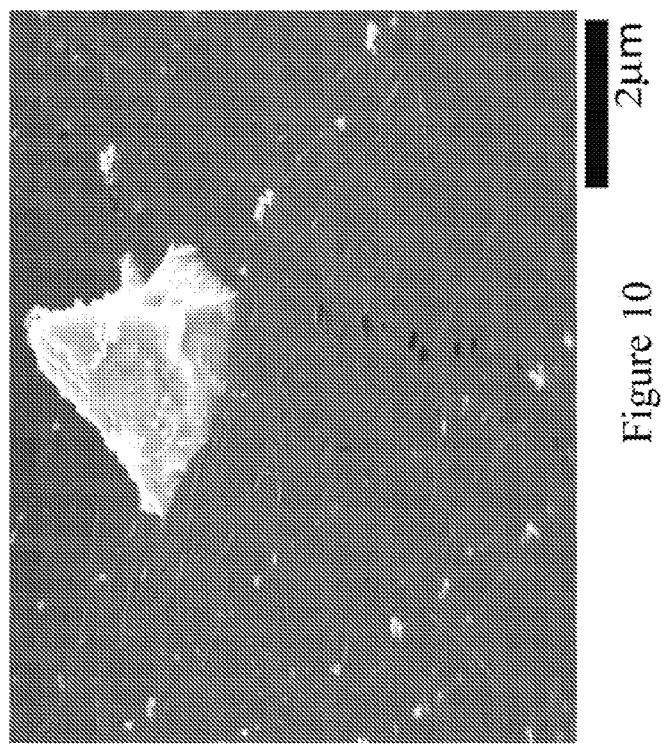
FIG. 10 is an SEM image of an isolated Cu island formed on a suspended graphene structure made using the scheme depicted in FIGS. 9A-9I.

FIG. 10 is an SEM image of an isolated Cu island formed on a suspended graphene structure made using the scheme depicted in FIGS. 9A-9I. In this embodiment, the graphene was grown on lower-purity foil, so remaining impurities were seen adhered to the graphene.

Scheme 5

Figure 11B:
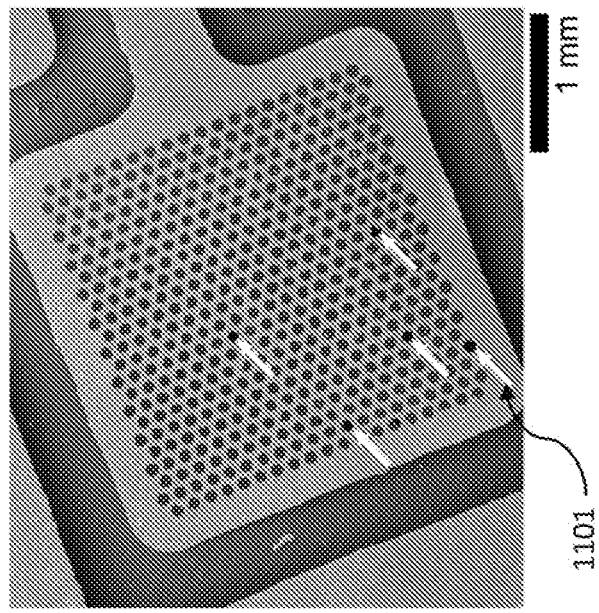
FIGS. 11A-11B are SEM images of an array of "individualized" mechanically isolated metal foil supports that have free-standing graphene drums (an array or individual drums) on them that were created using the same methods described in the above depicted schemes.
Figure 11A:
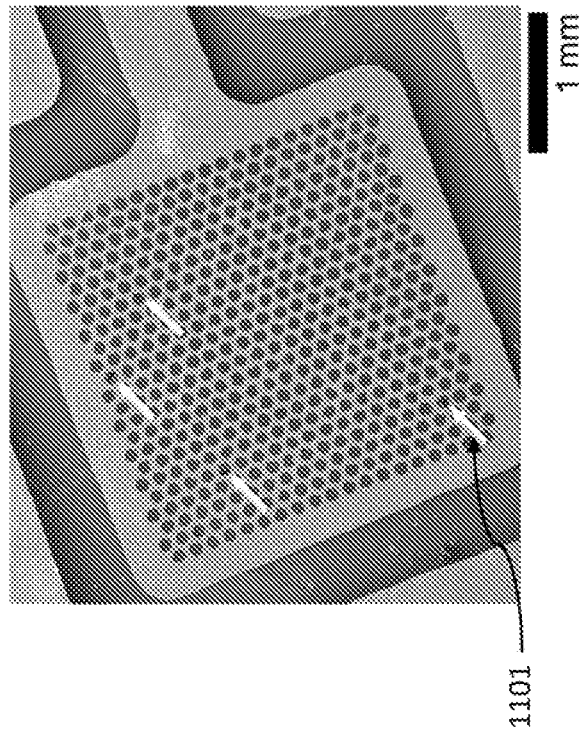

This embodiment utilizes a scheme (Scheme 5) for creating an array of "individualized" metal foil supports that have free-standing graphene windows (an array or individual windows) on them, created using the same protocols described in Schemes 1-4, above. FIGS. 11A-11B are SEM images of such an array of individualized mechanically-isolated metal foil supports. Sparse defects (tears, indicted with white arrows 1101) in the graphene can be seen in each image. By etching individually addressable regions of free-standing graphene windows, each region could be removed from the foil (as shown in FIGS. 12A-12B) without mechanically damaging neighboring graphene features (processes like cutting can damage graphene structures).

Figure 12:
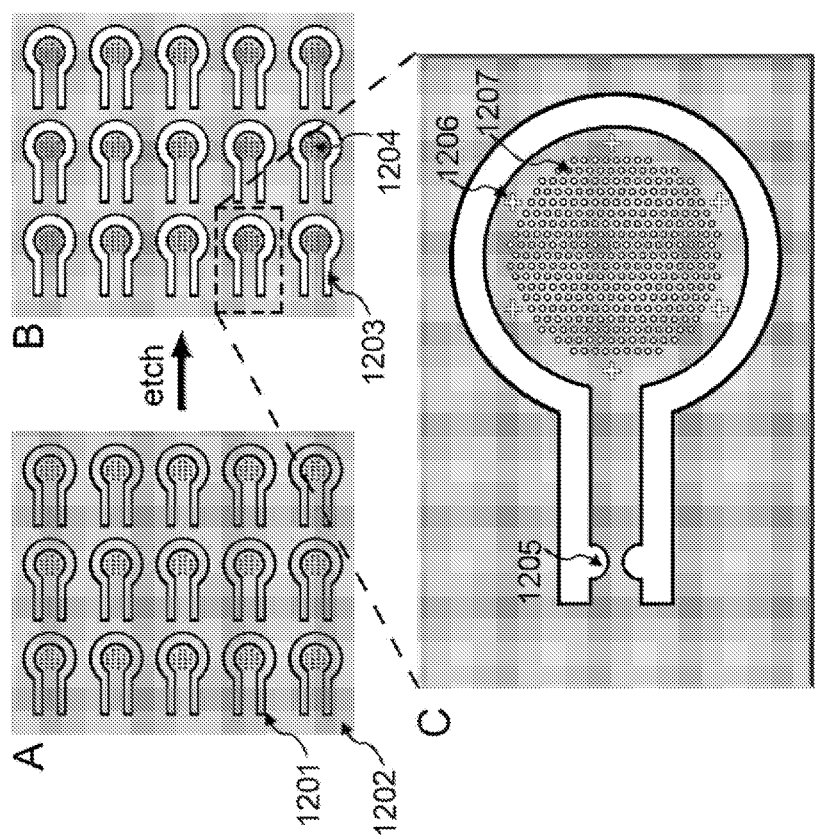
FIGS. 12A-12B depict etching the individually addressable regions of free-standing graphene spans (such as for the embodiments shown in FIGS. 11A-11B), in which each region can be removed from the foil without mechanically damaging neighboring graphene features.
FIG. 12C is a magnified view of a metal foil region in FIG. 12B.

As shown in FIG. 12A, photoresist features 1201 are patterned onto a graphene-modified metal foil 1202 (using the same or similar protocols described in above-mentioned Schemes 1-4). As shown in FIG. 12B, by etching through the exposed metal foil regions 1203, individualized arrays of free-standing graphene 1204 and 1207 can be produced. Additionally, other features can be etched into each metal support structure to, for example, (i) aid in removal of each region from the array using perforations or narrowed sections 1205 or (ii) alignment of the region to a chip structure using alignment marks 1206.

Figure 13:
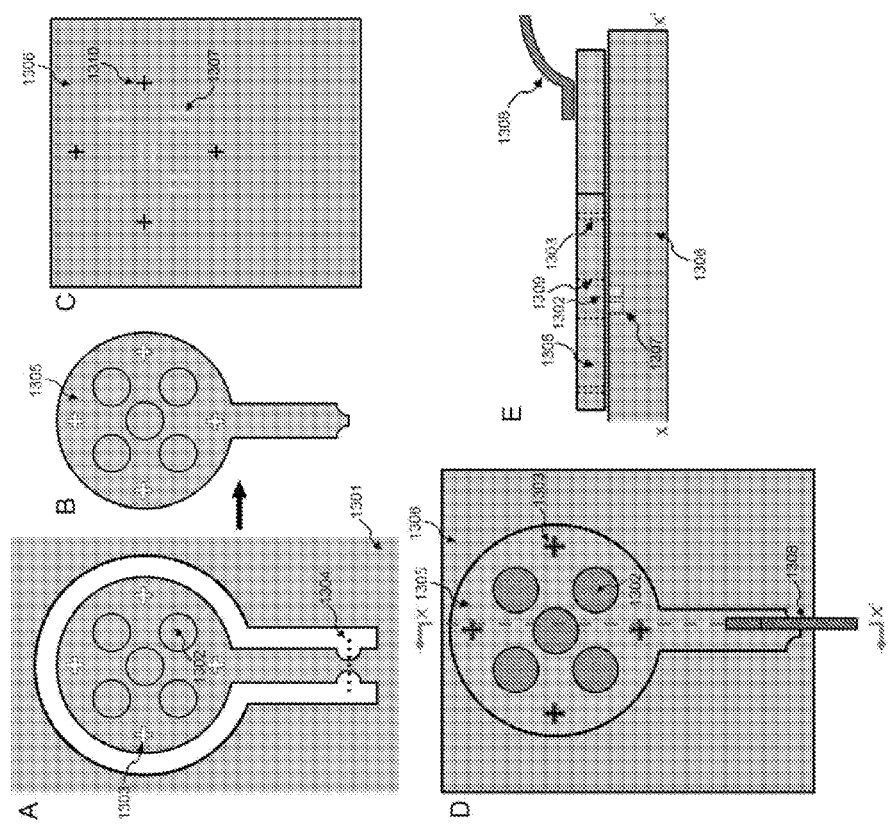
FIGS. 13A-13E depict a scheme for mating a graphene array made using the scheme of FIGS. 12A-12B with a metal oxide chip.

As shown in FIG. 13A, metal foil 1301 has isolated and individualized Cu support containing an array of free-standing graphene features 1302 with etched alignment marks 1303. As shown in FIG. 13B, the individual Cu support 1305 is partitioned from the main sheet of foil (at 1304 of FIG. 13A). As shown in FIGS. 13C-13D, metal oxide chip 1306 features 1307 that spatially correspond to graphene features 1302 (shown on FIG. 13A) on the foil array can be mated to the graphene array using alignment marks (1303 on FIG. 13C) on the metal oxide chip. As shown in FIG. 13E, the individual Cu support 1305 can be secured and wire bonded 1308.

Thus, alignment marks (1206 and 1303) can be etched into each Cu support to facilitate "pick-and-place" manufacturing (i.e., each array can be aligned and placed onto a supporting chip structure with alignment marks (1310 in FIG. 13C) so that the graphene features overlap specific regions of the chip that then integrate the graphene into the chip's functionality). Moreover, the metal support (e.g., Cu) provides a convenient route to "wire up" (1308 in FIG. 13E) the graphene and provide high current-carrying capacity to, or away from, the graphene structures. Additionally, this type of approach is useful for manufacturing arrays of graphene-based transmission electron microscopy (TEM) grids that are primarily used in research for sample analysis.

Figure 14:
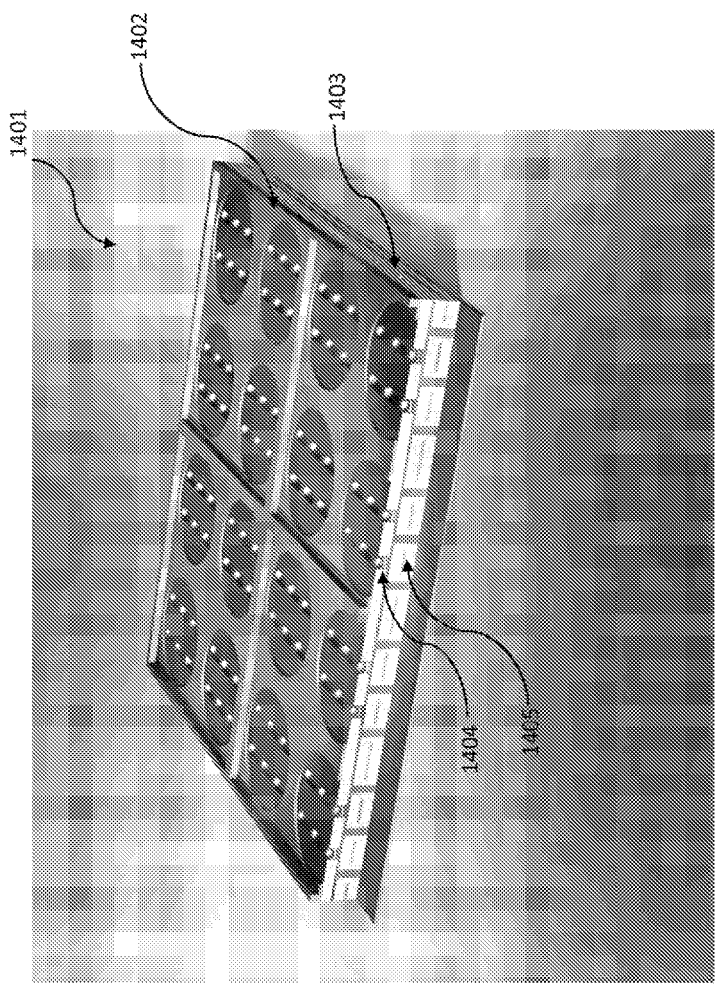
FIG. 14 illustrates a high current graphene switch that uses a graphene window assembly that is mated with an insulator-conductor assembly.

FIG. 14 illustrates a high current graphene switch 1401 that uses a graphene window assembly 1402 that is mated with an insulator-conductor assembly 1403. FIG. 14 shows the alignment of the graphene windows 1404 with a group of etched features 1405 in the insulator-conductor assembly 1403.

Figure 15:
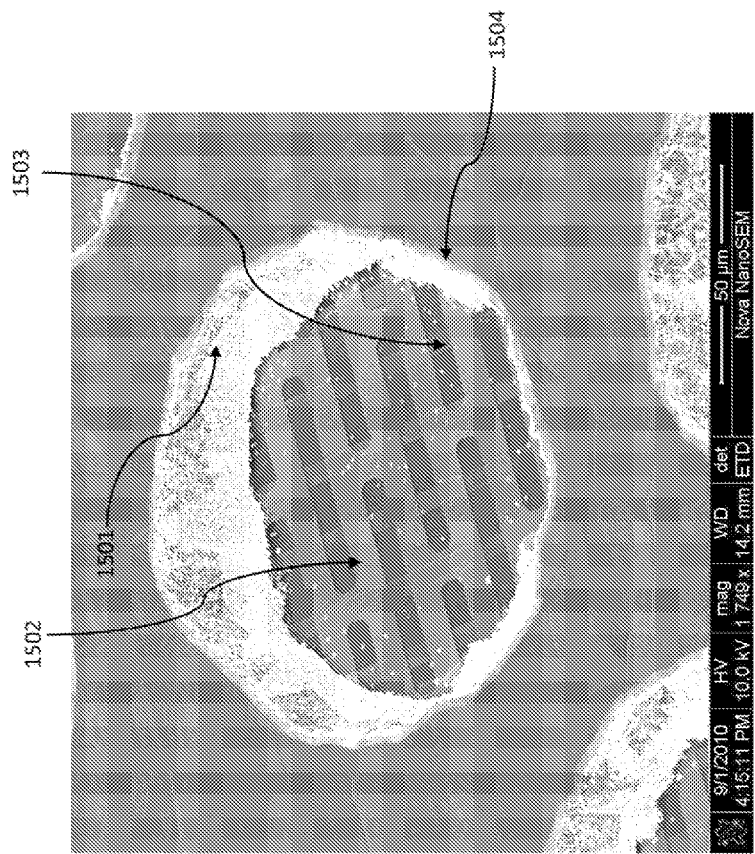
FIG. 15 is an SEM of a high current graphene switch.

FIG. 15 is an SEM of a high current graphene switch. FIG. 15 shows the etched copper foil 1501 and the graphene 1502 in contact with etched features in the insulator-conductor assembly 1503. FIG. 15 shows the graphene wrinkles and tears at the edge of the graphene window 1504 when these windows overlap with the etched features in the insulator-conductor assembly 1503. This is a reason why it is beneficial to align these two assemblies before bringing them together (i.e., to avoid such wrinkling/tearing).

A number of embodiments of the invention have been described. Nevertheless, it will be understood that various modifications may be made without departing from the spirit and scope of the invention. Accordingly, other embodiments are within the scope of the following claims.

While embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. Accordingly, other embodiments are within the scope of the following claims. The scope of protection is not limited by the description set out above, but is only limited by the claims which follow, that scope including all equivalents of the subject matter of the claims.

The disclosures of all patents, patent applications, and publications cited herein are hereby incorporated herein by reference in their entirety, to the extent that they provide exemplary, procedural, or other details supplementary to those set forth herein.

What is claimed is:

1. A method comprising:
   a. selecting a metal foil having a first face and a second face, wherein the metal foil comprises at least 99.8% by weight of metal;
   b. growing a first layer of graphene on the first face of the metal foil to form a graphene-modified foil, wherein the second face of the graphene-modified foil is selected from the group consisting of
      i. a second layer of graphene on the second face of the metal foil, wherein the second layer of graphene was grown during the step of growing the first layer of graphene, and
      ii. the second face of the metal foil;
   c. patterning the second face of the graphene-modified foil with a polymer, wherein
      the second face of the graphene-modified foil has an exposed region;
   d. etching the second face of the graphene-modified foil in the exposed region until exposing the first layer of graphene, wherein a graphene window is formed.

2. The method of claim 1, wherein the metal of the metal foil is Cu.

3. The method of claim 1, wherein the graphene is grown by CVD.

4. The method of claim 1 further comprising:
   a. before the step of growing the first layer of graphene, applying a protective coating on the second face of the metal foil, wherein the protective coating prevents graphene from growing on the second face of the metal foil during the step of growing the first layer of graphene;
   b. removing the protective coating from the second face of the metal foil such that the second face of the graphene-modified foil is the second face of the metal foil.

5. The method of claim 1 further comprising:
   a. growing the second layer of graphene on the second face of the metal foil during the step of growing the first layer of graphene; and
   b. removing the second layer of graphene on the second face before the step of patterning, such that the second face of the graphene-modified foil is the second face of the metal foil.

6. The method of claim 1, wherein the metal foil comprises at least 99.99% by weight of the metal.

7. The method of claim 1, wherein the metal foil is thermally annealed before growing the first layer of graphene.

8. The method of claim 7, wherein the step of thermally annealing increases average grain size in the metal foil.

9. The method of claim 1 further comprising depositing a material on the graphene on the first face of the graphene-modified foil before the step of patterning the second face of the graphene-modified foil with a polymer.

10. The method of claim 9, wherein the graphene window formed has a feature atop.

11. The method of claim 1, wherein the metal foil has native or doped impurities.

12. The method of claim 11, wherein, during the step of thermal annealing, the impurities move toward grain boundaries of the metal foil.

13. The method of claim 11, wherein the graphene window formed has adhered, concentrated impurities.

14. A method comprising:
   a. selecting a metal foil having a first face and a second face;
   b. thermally annealing the metal foil;
   c. after the step of annealing the metal foil, growing a first layer of graphene on the first face of the metal foil to form a graphene-modified foil, wherein the second face of the graphene-modified foil is selected from the group consisting of
      i. a second layer of graphene on the second face of the metal foil, wherein the second layer of graphene was grown during the step of growing the first layer of graphene, and
      ii. the second face of the metal foil;
   d. patterning the second face of the graphene-modified foil with a polymer, wherein the second face of the graphene-modified foil has an exposed region;
   e. etching the second face of the graphene-modified foil in the exposed region until exposing the first layer of graphene, wherein a graphene window is formed.

15. The method of claim 14, wherein the metal of the metal foil is Cu.

16. The method of claim 14, wherein the graphene is grown by CVD.

17. The method of claim 14 further comprising:
   a. growing the second layer of graphene on the second face of the metal foil during the step of growing the first layer of graphene; and
   b. removing the second layer of graphene on the second face before the step of patterning, such that the second face of the graphene-modified foil is the second face of the metal foil.

* * * * *